United States Patent
Chuang et al.

(10) Patent No.: US 9,735,245 B2
(45) Date of Patent: Aug. 15, 2017

(54) RECESSED SALICIDE STRUCTURE TO INTEGRATE A FLASH MEMORY DEVICE WITH A HIGH κ, METAL GATE LOGIC DEVICE

(71) Applicant: Taiwan Semiconductor Manufacturing Co., Ltd., Hsin-Chu (TW)

(72) Inventors: Harry Hak-Lay Chuang, Zhubei (TW); Wei Cheng Wu, Zhubei (TW); Shih-Chang Liu, Alian Township (TW); Ya-Chen Kao, Fuxing Township (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 14/481,987

(22) Filed: Sep. 10, 2014

(65) Prior Publication Data
US 2016/0056250 A1   Feb. 25, 2016

Related U.S. Application Data

(60) Provisional application No. 62/041,255, filed on Aug. 25, 2014.

(51) Int. Cl.
*H01L 29/423*   (2006.01)
*H01L 29/792*   (2006.01)
(Continued)

(52) U.S. Cl.
CPC .. *H01L 29/42344* (2013.01); *H01L 27/11573* (2013.01); *H01L 29/665* (2013.01); *H01L 29/66833* (2013.01); *H01L 29/792* (2013.01); *H01L 29/6659* (2013.01); *H01L 29/7833* (2013.01)

(58) Field of Classification Search
CPC ......... H01L 29/42344; H01L 29/42352; H01L 29/665; H01L 27/11573; H01L 29/42316; H01L 2924/1438; H01L 29/6634; H01L 29/66621; H01L 29/66628; H01L 29/8128; H01L 29/66348
See application file for complete search history.

(56) References Cited

U.S. PATENT DOCUMENTS 5,741,738 A   4/1998   Mandelman et al.
5,753,561 A   5/1998   Lee et al.
(Continued)

OTHER PUBLICATIONS

U.S. Appl. No. 14/547,251, filed Nov. 19, 2014.
(Continued)

*Primary Examiner* — Joshua King
(74) *Attorney, Agent, or Firm* — Eschweiler & Potashnik, LLC (57) ABSTRACT

Some embodiments of the present disclosure provide an integrated circuit (IC) for an embedded flash memory device. The IC includes a flash memory cell having a memory cell gate. A silicide contact pad is arranged in a recess of the memory cell gate. A top surface of the silicide contact pad is recessed relative to a top surface of the memory cell gate. Dielectric side-wall spacers extend along sidewalls of the recess from the top surface of the memory cell gate to the top surface of the silicide contact pad.

20 Claims, 8 Drawing Sheets

(51) Int. Cl.
  *H01L 29/66* (2006.01)
  *H01L 27/11573* (2017.01)
  *H01L 29/78* (2006.01)

(56) References Cited

U.S. PATENT DOCUMENTS

| | | | |
|---|---|---|---|
| 5,989,977 A | 11/1999 | Wu | |
| 6,165,906 A | 12/2000 | Bandyopadhyay et al. | |
| 6,171,180 B1 | 1/2001 | Koutny, Jr. et al. | |
| 6,433,382 B1* | 8/2002 | Orlowski | G11C 16/0433 257/315 |
| 6,709,922 B2* | 3/2004 | Ebina | H01L 27/11568 257/E21.679 |
| 6,818,939 B1* | 11/2004 | Hadizad | H01L 29/8083 257/288 |
| 7,078,296 B2 | 7/2006 | Chau et al. | |
| 7,838,922 B2* | 11/2010 | Li | B82Y 10/00 257/319 |
| 2003/0122185 A1* | 7/2003 | Wang | H01L 27/115 257/316 |
| 2004/0043595 A1* | 3/2004 | Lee | H01L 21/76889 438/592 |
| 2007/0037343 A1* | 2/2007 | Colombo | H01L 29/66545 438/231 |
| 2007/0164342 A1* | 7/2007 | Okazaki | H01L 21/28273 257/314 |
| 2007/0228498 A1* | 10/2007 | Toba | H01L 21/28282 257/411 |
| 2009/0115000 A1* | 5/2009 | Hwang | H01L 21/28114 257/408 |
| 2009/0315100 A1* | 12/2009 | Jeong | H01L 21/28282 257/324 |
| 2010/0006914 A1* | 1/2010 | Nakagawa | H01L 21/28282 257/304 |
| 2010/0193857 A1* | 8/2010 | Nakagawa | H01L 27/11521 257/324 |
| 2011/0095348 A1* | 4/2011 | Chakihara | H01L 21/28273 257/298 |
| 2011/0136309 A1* | 6/2011 | Grivna | H01L 29/407 438/270 |
| 2011/0303973 A1* | 12/2011 | Masuoka | H01L 21/823885 257/329 |
| 2012/0132978 A1* | 5/2012 | Toba | H01L 21/28282 257/316 |
| 2012/0217553 A1* | 8/2012 | Luo | H01L 21/823807 257/288 |
| 2012/0244694 A1* | 9/2012 | Shinohara | H01L 27/105 438/591 |
| 2013/0164895 A1* | 6/2013 | Zeng | H01L 29/7827 438/270 |
| 2014/0001529 A1* | 1/2014 | Hsieh | H01L 29/66825 257/314 |
| 2014/0167141 A1 | 6/2014 | Ramsbey et al. | |
| 2014/0167142 A1* | 6/2014 | Chen | H01L 29/792 257/326 |
| 2014/0227843 A1* | 8/2014 | Tsukamoto | H01L 29/6659 438/275 |
| 2015/0041875 A1* | 2/2015 | Perera | H01L 29/78 257/314 |
| 2015/0137206 A1* | 5/2015 | Liu | H01L 29/66825 257/316 |
| 2015/0179816 A1* | 6/2015 | Williams | H01L 21/28273 257/326 |
| 2015/0187892 A1* | 7/2015 | Yin | H01L 29/66492 438/296 |

OTHER PUBLICATIONS

Notice of Allowance Dated Apr. 28, 2016 U.S. Appl. No. 14/547,251.

Non Final Office Action Dated Dec. 10, 2015 U.S. Appl. No. 14/547,251.

* cited by examiner

RECESSED SALICIDE STRUCTURE TO INTEGRATE A FLASH MEMORY DEVICE WITH A HIGH κ, METAL GATE LOGIC DEVICE

REFERENCE TO RELATED APPLICATION

The present application claims priority to U.S. provisional patent application No. 62/041,255, entitled, "A RECESSED SALICIDE STRUCTURE TO INTEGRATE A FLASH MEMORY DEVICE WITH A HIGH K, METAL GATE LOGIC DEVICE," filed on Aug. 25, 2014, the contents of which are hereby incorporated by reference in their entirety.

BACKGROUND

The semiconductor manufacturing industry has experienced exponential growth over the last few decades. In the course of semiconductor evolution, the minimum feature sizes for semiconductor devices has decreased over time, thereby helping to increase the number of semi-conductor devices per unit area on successive generations of integrated circuits (ICs). This device "shrinkage" allows engineers to pack more devices and more corresponding functionality onto newer generations of ICs, and is consequently one of the underlying drivers of the modern digital age. Another advancement that has helped improve the functionality of ICs has been to replace traditional polysilicon gates with metal gates, and to replace traditional silicon dioxide gate dielectrics with so called high-K dielectrics. Whereas silicon dioxide has a dielectric constant of approximately 3.9, high-K dielectrics have a dielectric constant of more than 3.9, which helps to reduce gate leakage and allows faster switching for transistors.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A trend in the semiconductor manufacturing industry is to integrate different types of semiconductor devices onto a single integrated circuit (IC). Such integration can advantageously lower manufacturing costs, simplify manufacturing procedures, and increase performance of the final product. Embedded flash memory, which can integrate flash memory cells with other types of semiconductor devices, is one example of a technology where integration is advantageous. Traditional flash memory cells and corresponding logic devices are formed with polysilicon gates insulated by silicon dioxide. As semiconductor feature sizes get smaller, however, the logic devices of such embedded flash memory devices are reaching performance limits. According, high κ metal gate (HKMG) technology has become one of the front runners for the logic devices in the next generation of embedded flash memory devices. HKMG technology employs a metal gate separated from the underlying substrate by a material with a high dielectric constant κ (relative to silicon dioxide). The high κ dielectric reduces leakage current and increases the maximum drain current, and the metal gate mitigates the effects of Fermi-level pinning and allows the gate to be employed at lower threshold voltages. Further, the high κ dielectric and the metal gate collectively reduce power consumption. Thus, the aim for future generations of embedded flash memory is to integrate flash cells having polysilicon gates with HKMG logic devices.

Recent attempts to form such embedded flash memory devices have suffered from shortcomings. In some attempts, the flash devices and logic devices have both been initially formed with polysilicon gates, albeit that the polysilicon gates for the logic devices are sacrificial polysilicon gates insulated by a high κ dielectric whereas the polysilicon gates for the flash devices are the actual flash gates insulated by silicon dioxide or another dielectric. With the polysilicon gates for the flash memory and logic devices initially formed, silicide is formed over source/drain regions of the memory cells and logic devices. The silicide, which can also extend over top surfaces of the gates, advantageously reduces the resistance between the source/drain regions and subsequently formed contacts. An interlayer dielectric is then formed over the memory cells and logic devices, and a first planarization is carried out on the interlayer dielectric until top surfaces of the polysilicon gates are exposed. Unfortunately, due to silicide being removed from top surfaces of the polysilicon gates during planarization, this first planarization can cause metal contamination that degrades other portions of the IC. Hence, previous efforts to integrate HKMG technology with flash have been less than ideal.

In view of the foregoing, the present disclosure is directed to improved methods of integrating a flash memory device with high κ, metal gate logic devices, as well as corresponding semiconductor structures. The improved method uses a silicide contact pad arranged in a recess within the top surface of a memory cell gate. In some embodiments, a dielectric sidewall spacer extends along sidewalls of the recess from an upper surface of the memory cell gate to the top surface of the silicide contact pad. The improved methods and semiconductor structures advantageously limit metal contamination during planarization operations and reduce resistivity between the gates of the flash memory cell devices and subsequently formed contacts.

Figure 1:
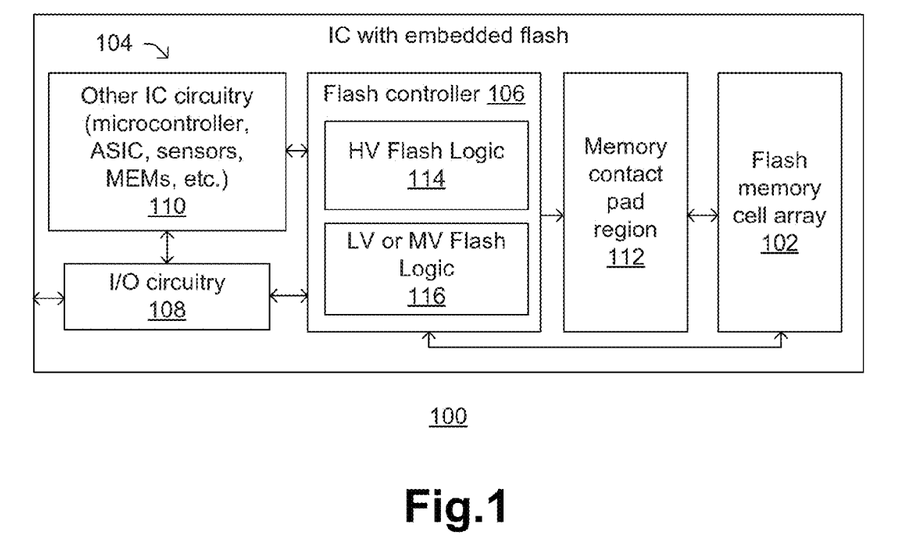
FIG. 1 illustrates a block diagram of some embodiments of an embedded flash memory device in accordance with some embodiments.

FIG. 1 illustrates an integrated circuit (IC) 100 which includes an array of flash memory cells 102, which store data, and periphery circuitry 104, which supports operation of the flash memory cells and/or provides other desired functionality. In FIG. 1's example, the periphery circuitry 104 includes a flash controller 106, input/output (I/O) circuitry 108, and other optional IC circuitry 110, such as microcontroller circuitry, application specific integrated circuit (ASIC) circuitry, sensors, and/or microelectromechanical systems (MEMS) for example. A memory contact pad region 112, which is distinct from cells of the memory array 102, can provide ohmic coupling between the flash memory array 102 and high voltage (HV) flash logic 114 and/or medium voltage (MV) or low-voltage (LV) flash logic 116 within flash controller 106. The memory cells of array 102 are localized to a memory region of the IC, and memory contact pad region 112 and logic devices of flash controller 106 are localized to a logic region of the IC, which is typically arranged around the periphery of the memory region.

Figure 2A:
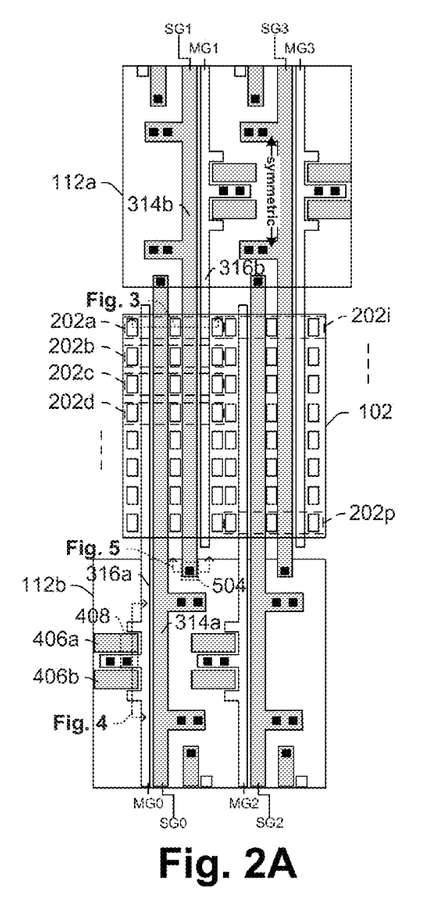
FIG. 2A illustrates a top view of some embodiments of an embedded flash memory device in accordance with some embodiments.
Figure 2B:
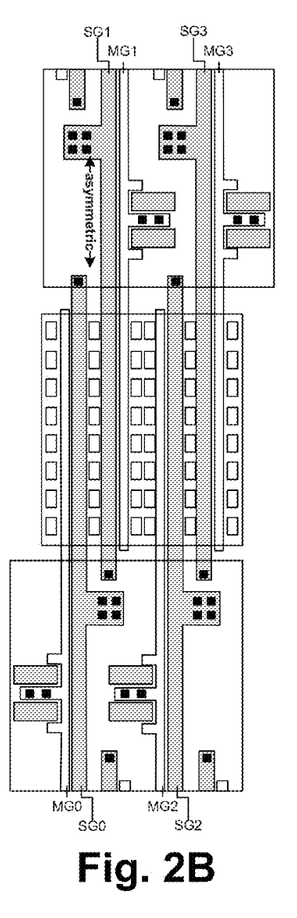
FIG. 2B illustrates a top view of some alternate embodiments of an embedded flash memory device in accordance with some embodiments.

With reference to FIG. 2A, a sample layout view of the memory contact pad region 112 and flash memory cell array 102 is provided. For purposes of simplicity, the illustrated array 102 is shown as being made up of sixteen pairs of split gate flash cells 202a-202p. It will be appreciated that although FIG. 2A shows sixteen pairs of flash memory cells, that other arrays can be made up of only a single flash memory cell or can include as many as a million memory cells, billion memory cells, etc. Further, although two distinct memory contact pad regions—namely upper and lower memory contact pad regions 112a, 112b—are shown, other devices can include only a single memory contact pad region or can include more than two memory contact pad regions. Thus, the illustrated layout is just an example, and is not to be limiting of the present concept. As will be appreciated in more detail below, in FIG. 2A select gates are symmetric, whereas FIG. 2B shows another example where select gates are asymmetric in some regards.

Figure 3:
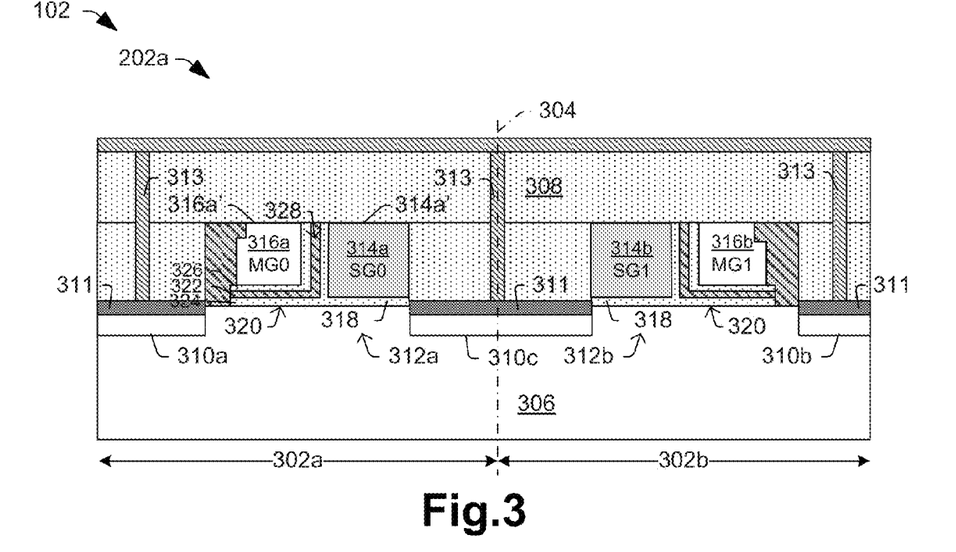
FIG. 3 illustrates a cross-sectional view of some embodiments of a pair of split gate flash memory cells as indicated in FIG. 2A.

As shown in FIG. 3, within the array 102, each pair of split gate flash cells, e.g., pair 202a, is made up of a first memory cell 302a and a second memory cell 302b, which are mirror images of one another about an axis of symmetry 304 in some implementations. The first and second memory cells 302a, 302b (as well as the semiconductor devices of the peripheral circuitry 104 of FIG. 1) are formed over and/or within a semiconductor substrate 306 and are covered by an interlayer dielectric 308. The pair of split gate flash cells 202a includes two individual source/drain regions 310a, 310b, and a common source/drain region 310c that is shared between the memory cells 302a, 302b. Silicide regions 311 are arranged on upper surface regions of the source/drain regions, and promote ohmic coupling of contacts 313 to the source/drain regions. Channel regions 312a, 312b separate the common source/drain region 310c from the individual source/drain regions 310a, 310b, respectively. The first and second memory cells include select gates 314a, 314b, respectively and memory gates 316a, 316b, respectively, over their channel regions 312a 312b, respectively. Each select gate and memory gate comprises a conductive material, such as a doped polysilicon layer. The select gates are disposed over a dielectric layer 318; and memory gates are disposed over a charge trapping dielectric 320 having one or more dielectric layers. In one example, charge trapping dielectric 320 includes a charge trapping silicon nitride layer 322 sandwiched between two silicon dioxide layers 324, 326 to create a three-layer stack collectively and commonly referred to as "ONO." Other charge trapping dielectrics may include a silicon-rich nitride film or a layer of silicon nanoparticle dots, or any film that includes, but is not limited to, silicon, oxygen, and nitrogen in various stoichiometries. A vertical dielectric 328 is also disposed between select gates and memory gates of each memory cell for electrical isolation between the two gates. In some examples, vertical dielectric 328 and charge trapping dielectric 320 are the same dielectric, while other examples form one dielectric before the other (e.g., they can have different dielectric properties.) As such, vertical dielectric 328 need not include the same film structure as charge trapping dielectric 320.

Data is written to each memory cell, e.g., 302a, by changing the amount of charge trapped in the cell's charge trapping layer 320. The amount of trapped charge, which screens the electric field seen in the cell's channel region, e.g., 312a, thus controls the effective threshold voltage ($V_t$) of the memory cell and sets the data state stored in the cell. An example program, erase, and read operation will now be described as it relates to memory cell 302a. In order to "program" a high amount of charge to the cell, a positive voltage, on the order of 5 volts for example, is applied to individual source/drain region 310a while common source/drain region 310c and substrate 306 are grounded. A low positive voltage, on the order of 1.5 volts for example, is applied to select gate 314a while a higher positive voltage, on the order of 8 volts for example, is applied to memory gate 316a. As electrons are accelerated between the source and drain within channel region 312a, some of them will acquire sufficient energy to be injected upwards and get trapped inside charge trapping dielectric 320. This is known as hot electron injection. In one example of charge trapping dielectric 320, the electrons are trapped within nitride layer 322. The trapped charge within charge trapping dielectric 320 stores the "high" bit within memory cell 302a, even after the various supply voltages are removed.

In order to "erase" the stored charge within memory cell 302a and return the state of memory cell 302a to a "low" bit, a positive voltage, on the order of 5 volts for example, is applied to common source/drain 310c while individual source/drain region 310a is floated or at a certain bias, and select gate 314a and substrate 306 are typically grounded. A high negative voltage, on the order of −8 volts for example, is applied to memory gate 316a. The bias conditions between memory gate 316a and common source/drain region 310c generate holes through band-to-band tunneling. The generated holes are sufficiently energized by the strong electric field under memory gate 316a and are injected upwards into charge trapping dielectric 320. The injected holes effectively erase the memory cell 302a to the "low" bit state.

In order to "read" the stored bit of memory cell 302a, a low voltage is applied to each of the select gate 314a, memory gate 316a, and individual source/drain region 310a in the range between zero and three volts, for example; while common source/drain region 310c and substrate 306 are typically grounded. In order to clearly distinguish between the two states, the low voltage applied to the memory gate 316a is chosen so that it lies substantially equidistant between the threshold voltage necessary to turn on the transistor when storing a "high" bit and the threshold voltage necessary to turn on the transistor when storing a "low" bit. For example, if the application of this equidistantly-arranged low voltage during the "read" operation caused substantial current to flow between regions 310a and 310c, then the memory cell is deemed to store a "low" bit. On the other hand, if the application of the equidistantly-arranged low voltage during the "read" operation does not cause substantial current to flow between regions 310a and 310c, then the memory cell is deemed to store a "high" bit.

During read and write operations, it is important to ensure that these bias voltages are ohmically provided to various regions of the memory cell. In particular, it is important to ensure that the bias voltages are ohmically provided to select gate 314a and memory gate 316a, either of which can be referred to generically as a "memory cell gate". Erase gates, control gates, wordlines, and other gate terminals of a memory cell can also be referred as "memory cell gates" in the context of this disclosure. Thus, providing silicide contact pad regions for the memory cell gates is important, particularly in a manner that limits or prevent metal contamination during CMP operations as could occur during traditional flash processes.

Figure 4:
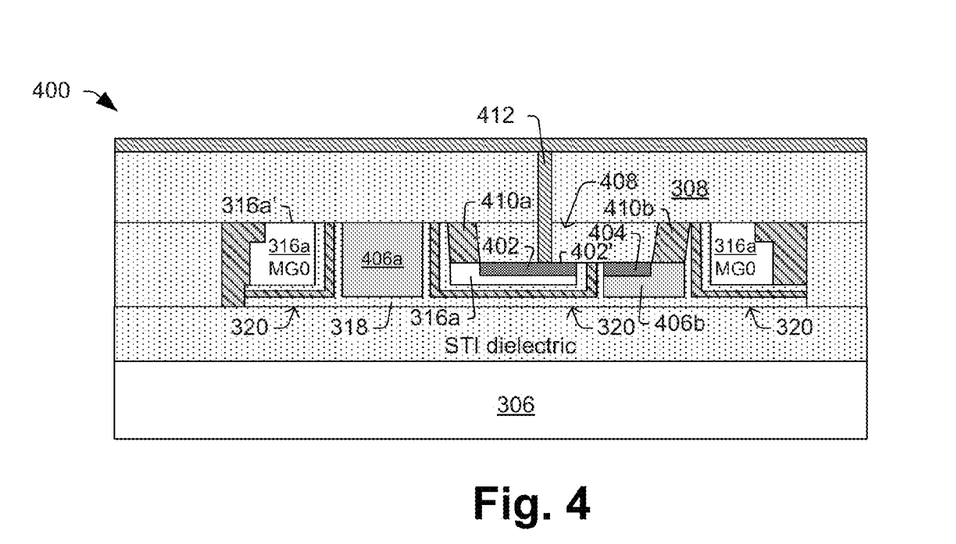
FIG. 4 illustrates a cross-sectional view of some embodiments of a silicide contact region disposed on a recessed upper surface of a memory gate as indicated in FIG. 2A.

FIG. 4 shows a cross-sectional view of a silicide contact pad region 400 for a memory gate, as indicated in FIG. 2A. This silicide contact pad region 400 includes a memory gate silicide contact 402 on a top surface of a recessed region of memory gate 316a, and also includes a dummy select gate silicide contact 404 on a top surface of a recessed region of dummy select gate 406b. In particular, the memory gate silicide contact pad 402 and dummy select gate silicide contact pad 404 are arranged in a recess 408, wherein a top surface of the memory gate silicide contact pad (402') is recessed relative to a top surface of the memory gate (316a'). Dielectric sidewall spacers 410a, 410b, such as an oxide- and/or nitride-containing spacer material, extend along sidewalls of the recess 408 from a height of the top surface of the memory gate 316a' to a depth of the top surface of the memory gate silicide contact pad 402'. The recess 408 is asymmetric with regards to the memory gate 316a and the dummy select gate 406b. Thus, the recess 408 exposes a first width of the memory gate 316a and a second width of the dummy select gate 406b, wherein the first width is larger than the second width. A vertical contact 412 is coupled to the metal gate silicide contact pad 402. As can be seen from viewing FIG. 2A and FIG. 4 concurrently, the memory gate 316a extends from the memory contact pad region 112b to the flash memory cells of the array 102. In particular, the memory gate 316a ultimately extends over the channel region of the flash cell 302a, and the memory gate silicide contact pad 402 helps provide ohmic coupling. As can be seen by comparing FIG. 3 and FIG. 4, a top surface of memory gate silicide contact 402' in the memory contact pad region is recessed relative to the top surfaces of select gates (e.g., 314a') and/or memory gates (e.g., 316a') in the memory array region 102. Advantageously, recessing the memory gate silicide contact 402 in the memory contact pad region relative to the top surface of the select gates and/or memory gates in the memory array region mitigates the possibility of silicide contamination in the wake of planarization operations.

Figure 5:
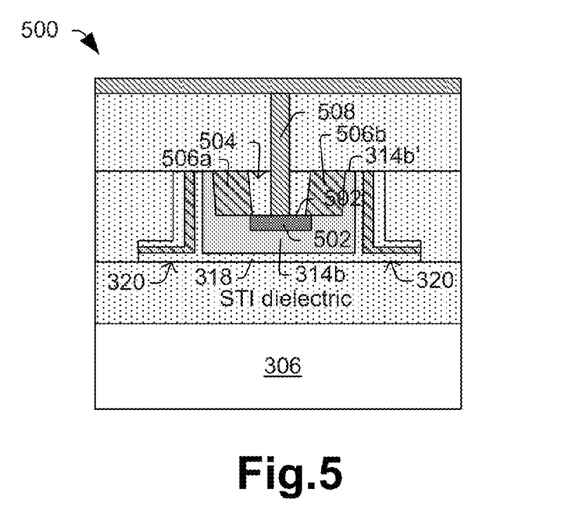
FIG. 5 illustrates a cross-sectional view of some embodiments of a silicide contact region disposed on a recessed upper surface of a select gate as indicated in FIG. 2A.

FIG. 5 shows a cross-sectional view of a silicide contact pad region 500 for a select gate 314b, as indicated in FIG. 2A. This silicide contact pad region 500 includes a select gate silicide contact 502 arranged in a recess 504 on a top surface of a recessed region of select gate 314b. A top surface of the select gate silicide contact pad (502') is recessed relative to a top surface of the select gate (314b'). Dielectric sidewall spacers 506a, 506b, such as an oxide- and/or nitride-containing spacer material, extend along sidewalls of the recess 504 from a height of the top surface of the select gate 314b' to a depth of the top surface of the select gate silicide contact 502'. The select gate silicide contact 502 extends continuously over the upper surface of the select gate 314b in the recess 504 between sidewalls spacers 506a, 506b. A vertical contact 508 is coupled to the select gate silicide contact 502. As can be seen from viewing FIG. 2A and FIG. 5 concurrently, the select gate 314b extends from the memory contact pad region 112b to the flash memory cells of the array 102. In particular, the select gate 314b ultimately extends over the channel region of the flash cell, and the select gate silicide contact pad 502 helps provide ohmic coupling. As can be seen by comparing FIG. 3 and FIG. 5, a top surface of select gate silicide contact 502' in the memory contact pad region is recessed relative to the top surfaces of select gates (e.g., 314b') and/or memory gates (e.g., 316a') in the memory array region 102. Advantageously, recessing the select gate silicide contact 502 in the memory contact pad region relative to the top surface of the select gates and/or memory gates in the memory array region mitigates the possibility of silicide contamination in the wake of planarization operations.

Figure 6:
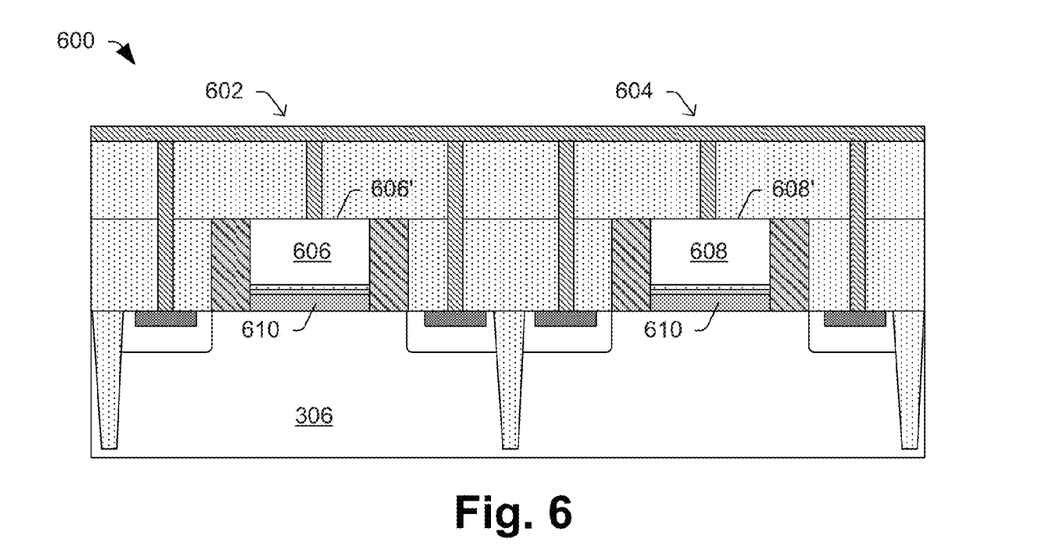
FIG. 6 illustrates a cross-sectional view of some embodiments of high κ metal gate (HKMG) transistors which are integrated on the same IC with an embedded flash memory device.

FIG. 6 illustrates a cross-sectional view of a portion of a high-voltage (HV) logic circuit 600, such as may be used in the high-voltage flash logic (see e.g., FIG. 1, 114) to drive memory gates, for example. The HV logic circuit 600 includes an n-type HV transistor 602 and a p-type HV transistor 604. The n-type transistor 602 can have a gate electrode 606 made of a first metal with a first workfunction, and the p-type transistor 604 can have a gate electrode 608 made of a second metal with a second workfunction that differs from the first workfunction. A high-k gate dielectric 610 separates the HV gate electrodes 606, 608 from the substrate 306. In some embodiments, the high-k gate dielectric can be a different material from the gate dielectric used in the flash memory cells, and can be thicker that the gate dielectric of the flash memory cells in some instances. Top HV gate electrode surfaces 606', 608' are co-planar with top surfaces of the select gates and memory gates (e.g., 314a', 316a').

Figure 7:
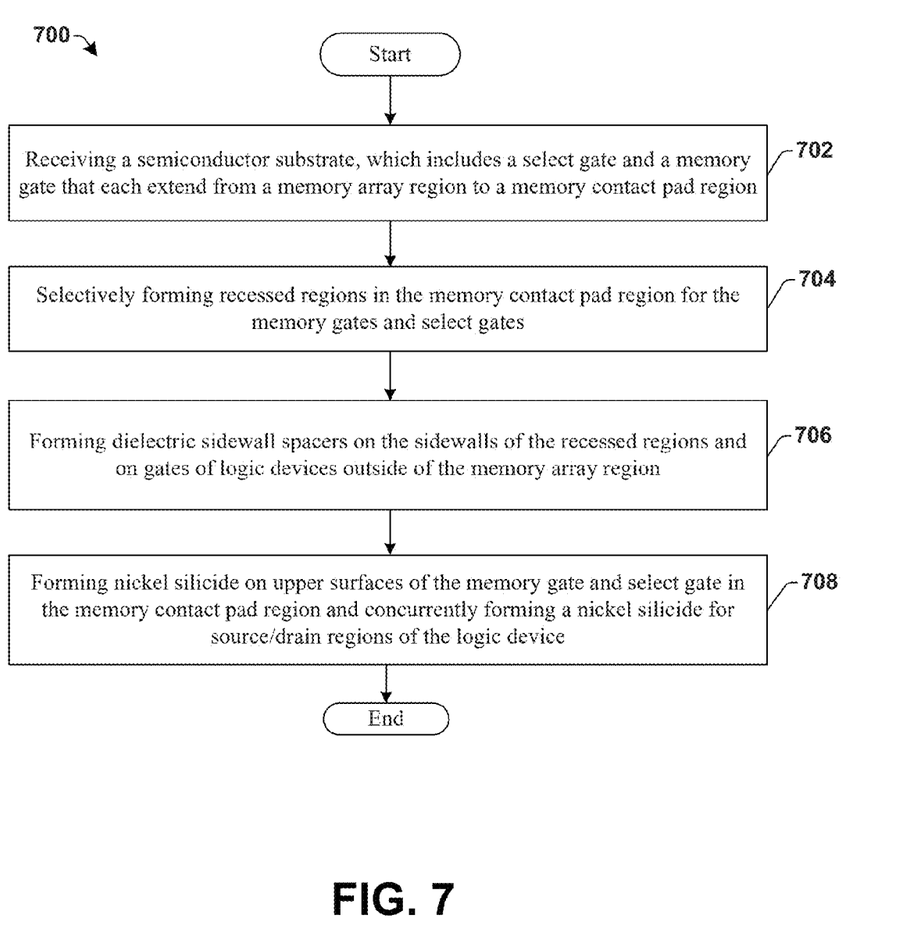
FIG. 7 illustrates a flow chart of some embodiments of a method of manufacturing a semiconductor structure with embedded flash memory cell devices and high κ, metal gate logic devices, the memory cell devices including recessed gates upon which silicide is formed.

FIG. 7 illustrates a method of forming an embedded flash memory device in accordance with some embodiments. While the disclosed methods (e.g., the methods described by the flowchart 700 or cross-sectional views of FIGS. 8-14) are illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases According to the method 700, a semiconductor substrate is received at 702. The substrate includes a select gate and a memory gate, each of which extend from a memory array region to a memory contact pad region on the substrate. At 704, recessed regions are selectively formed in the memory contact pad region for the memory gates and select gates. At 706, dielectric sidewall spacers are formed on the inner sidewalls of the recessed regions and on outer gate sidewalls of logic devices arranged outside of the memory array region. At 708, nickel silicide is formed on upper surfaces of the memory gate and select gate in the memory contact pad region and nickel silicide is concurrently formed for source/drain regions of the logic devices. This process is advantageous in that it allows concurrent formation of nickel silicide regions for a number of regions, which streamlines processing. This process also limits risk of contamination due to planarization of silicide regions which are formed in recessed regions of memory gates and select gates.

FIGS. 8-14 depict a series of cross-sectional views that collectively depict a method of manufacturing a semiconductor structure at various stages of manufacture. For clarity, FIGS. 8-14 are described in relation to the method 700, however, it will be appreciated that the method 700 is not limited to the structures disclosed in FIGS. 8-14. Further, it will be appreciated that each of FIGS. 8-14 show a cross-sectional view depicting a memory gate contact region 802 (such as previously shown in FIG. 4), a select gate contact region 804 (such as previously shown in FIG. 5), and a logic region 806 (such as a high-voltage logic region previous shown in FIG. 6). For convenience, these regions 802-806 are shown in the cross-sectional views of FIGS. 8-14 as being next to one another, however, in some embodiments these regions are actually spaced apart from one another, such as shown in previous FIG. 2A.

Figure 8:
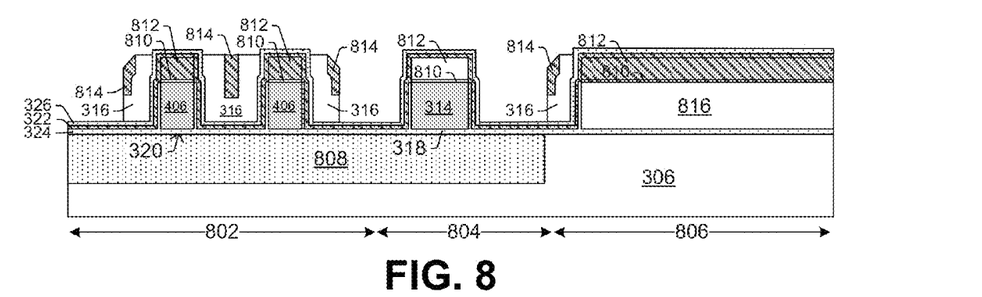
FIGS. 8-14 illustrate a series of cross-sectional views that collectively depict a method of forming an integrated circuit with embedded flash memory and a recessed silicide contact pad for the embedded flash memory in accordance with some embodiments.

FIG. 8 illustrates a cross-sectional view of a semiconductor substrate 306, such as provided in one example of Action 702 in FIG. 7. As shown by FIG. 8, the substrate includes a memory gate contact region 802, a select gate contact region 804, and a logic region 806. The substrate also includes memory cell regions, such as previously shown in FIG. 3, but which are not expressly shown in FIG. 7 for simplicity. The semiconductor substrate 306 is typically planar with a uniform thickness. Further, the semiconductor substrate 306 is, for example, a bulk substrate of silicon, germanium, or group III and group V elements. Alternatively, the semiconductor substrate 306 is, for example, a semiconductor-on-insulator (SOI) substrate. The substrate 306 can also include multiple wafers or dies which are stacked, such as in a 3D IC configuration, or can be a single wafer or die that is later combined with other wafers or dies to manufacture a 3D IC.

The substrate 306 includes an isolation region 808, such as a shallow trench isolation (STI) region, which includes dielectric material or doped semiconductor material to promote isolation between neighboring devices. The memory gate contact regions 802 and select gate contact regions 804 are arranged over this STI region 808. Select gates 314 and memory gates 316, which can be made of doped polysilicon in some implementations, can each extend from a memory array region to a memory contact pad region. The select gates 314 are disposed over a dielectric layer 318, such as a silicon dioxide layer for example; and the memory gates 316 are disposed over a charge trapping dielectric 320 having one or more dielectric layers. In one example, charge trapping dielectric 320 includes a charge trapping silicon nitride layer 322 sandwiched between two silicon dioxide layers 324, 326 to create a three-layer stack collectively and commonly referred to as "ONO." Other charge trapping dielectrics may include a silicon-rich nitride film or a layer of silicon nanoparticle dots, or any film that includes, but is not limited to, silicon, oxygen, and nitrogen in various stoichiometries. Dummy select gates 406, which can be made of polysilicon, are disposed on outer sidewalls of the memory gates 316 in the memory gate contact region 802. An etch stop layer 810 is arranged over the select gates and memory gates, and a hard mask layer 812, such as a nitride or a multilayer nitride-oxide-nitride (NON) film, is arranged over the etch stop layer 810. A spacer material 814, such as a nitride- or oxide-containing material is also arranged along upper sidewalls of the gate structures. A sacrificial gate electrode, such as made of polysilicon, is arranged in the logic region 806. A logic gate 816, which can be a sacrificial logic gate made of polysilicon, for example, or which can be a metal logic gate, is also illustrated.

Figure 9:
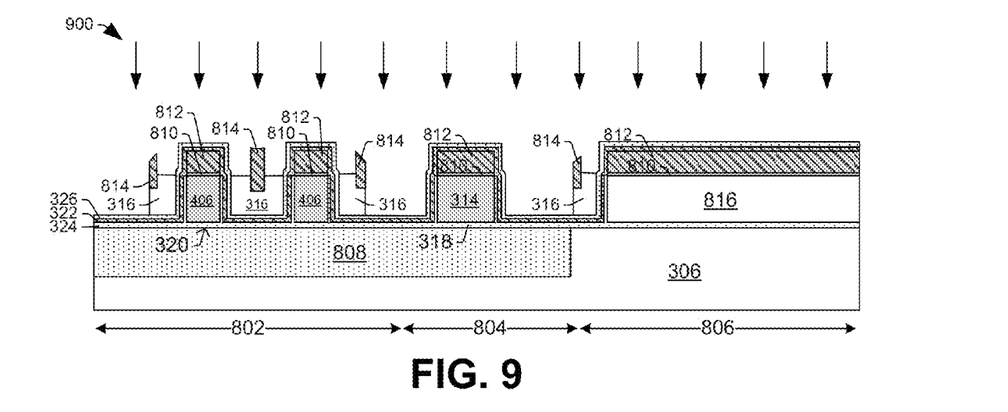

In FIG. 9, a first etch 900 is performed to recess the memory gates 316. As shown, in some embodiments this first etch is a selective etch that etches polysilicon while leaving oxide and/or nitride material substantially intact. This first etch can be carried out for a pre-determined time to reduce the height of the memory gates 316 so their upper surfaces are close to the height of the select gates 314.

Figure 10:
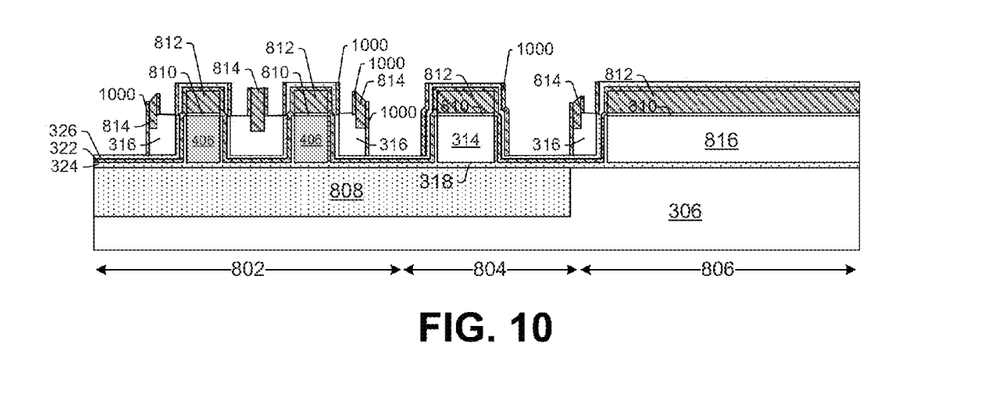

In FIG. 10, a memory gate seal material 1000, such as a nitride material for example, is formed along sidewalls of the memory gates and dummy select gates, as well as sidewalls of the logic devices. In some embodiments, this memory gate seal material can be formed by forming a conformal layer overlying the structure, followed by an anisotropic etch back to remove horizontal portions of the conformal layer while leaving vertical sidewall spacers 1000 over the structure.

Figure 11:
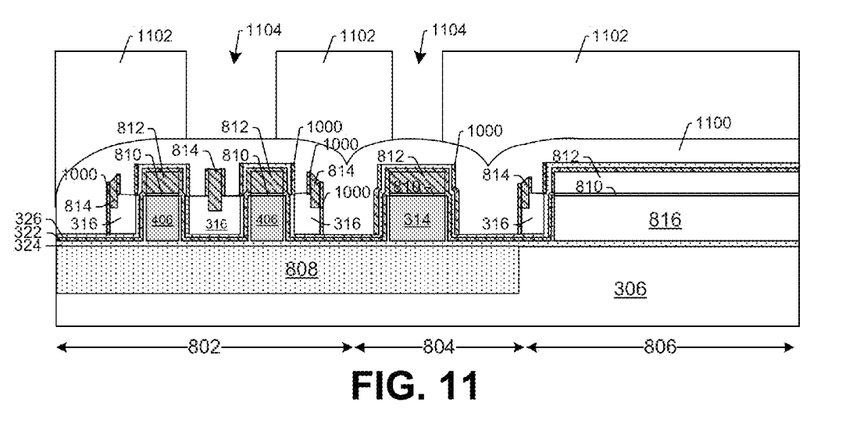

In FIG. 11, a bottom anti-reflective coating (BARC) layer 1100 is formed, and a photoresist layer 1102 is formed over the BARC layer 1100. The photoresist layer 1102 is then selectively exposed to light, by positioning a photomask or reticle over the structure, and shining radiation (e.g., visible light) through the photomask/reticle. In this way, a pattern on the photomask/reticle is transferred to the photoresist layer 1102, and then the photoresist layer is developed to reproduce the pattern on the photomask/reticle. In particular, the patterned photoresist layer includes recesses 1104 over regions where silicide is to be formed.

Figure 12:
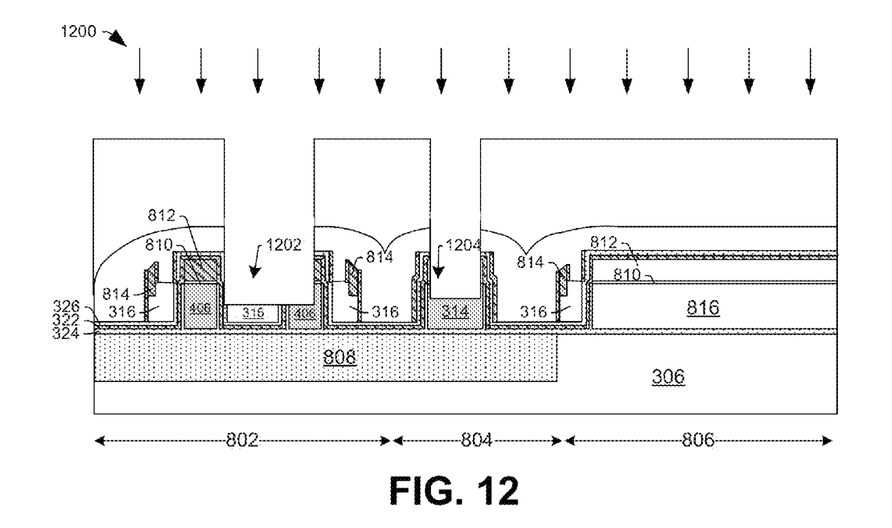

In FIG. 12, a second etching process 1200 is carried out. In some embodiments, this etch 1200 is a non-selective etch that removes oxide, nitride, and polysilicon at substantially equal rates. Thus, this second etch process forms a recessed memory gate contact pad region 1202 and a recessed select gate contact pad region 1204.

Figure 13:
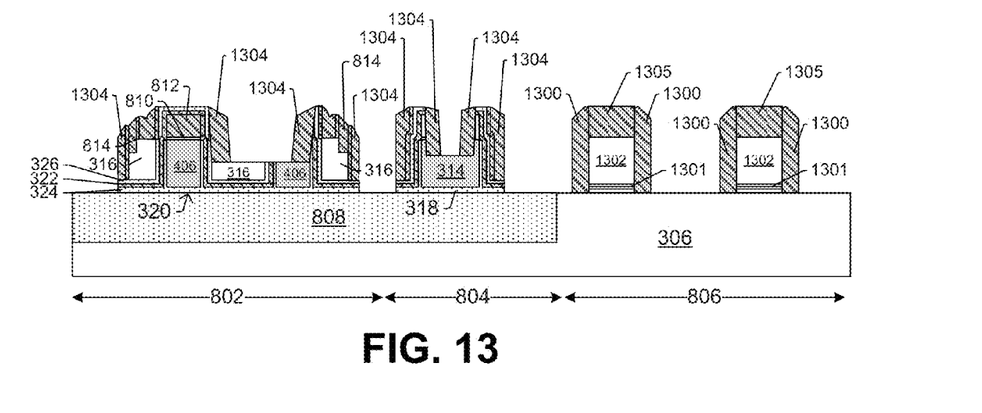

After FIG. 12, BARC layer 1100 and patterned photoresist layer 1102 are removed, and layers 816, 810, and 812 are removed from the logic region 806. A high-k dielectric layer 1301, logic gate layer 1302, and capping layer 1305 are formed and patterned in logic region 806. Next, as shown in FIG. 13, sidewall spacers 1300, such as nitride sidewall spacers, are formed on opposite edges of logic gate electrodes 1302. At the same time, this material used for sidewalls 1300 forms sidewall spacers 1304 that line the recessed contact pad regions 1202, 1204. The sidewall spacers 1300 and 1304 can be formed by providing a conformal liner over the structure, and then performing an anisotropic etch to remove horizontal portions of the conformal liner. Source/drain extension regions (not shown)—also referred to as "lightly doped drain" (LDD) regions in some contexts—are subsequently formed under the sidewall spacers 1300.

Figure 14:
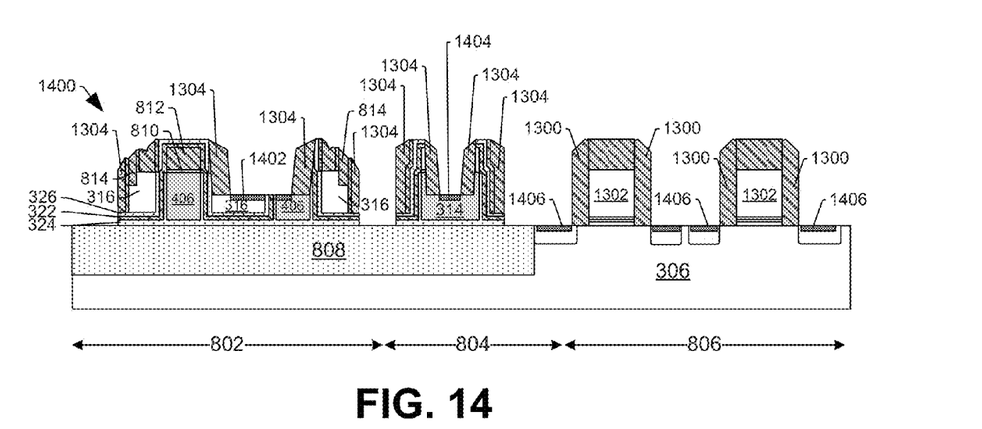

In FIG. 14, nickel silicide regions 1400 are formed. The nickel silicide regions 1400 are, for example, nickel silicide, cobalt silicide, or titanium silicide. The conductive contacts are, for example, formed of one or more of titanium, titanium nitride, and tungsten. In particular, nickel silicide is concurrently formed in the recessed memory gate contact pad region (1402), select gate contact pad region (1404), source/drain regions of the logic devices (1406), and in source/drain regions of the flash memory cells (see 311 FIG. 3). Because the silicide for the flash devices and logic devices are formed concurrently, this manufacturing procedure tends to streamline manufacturing compared to other techniques.

Although various embodiments have been illustrated with regards to split gate flash memory cells, it will be appreciated that the present disclosure is also applicable to various types of flash memory. For example, flash memory cell devices include silicon-oxide-nitride-oxide-silicon (SONOS) split gate flash memory cell devices, metal-oxide-nitride-oxide-silicon (MONOS) split gate flash memory cell devices, and third generation SUPERFLASH (ESF3) memory cell devices. Another type of flash memory that is contemplated as falling within the scope of this disclosure is stacked gate flash memory cell. Split gate flash memory cell devices have several advantages over stacked gate flash memory cell devices, such as lower power consumption, higher injection efficiency, less susceptibility to short channel effects, and over erase immunity; but concepts of the present disclosure are applicable to a wide range of flash memory and are not limited to split gate flash.

Thus, as can be appreciated from above, some embodiments of the present disclosure provides an integrated circuit (IC) for an embedded flash memory device. The IC includes a flash memory cell having a memory cell gate. A silicide contact pad is arranged in a recess of the memory cell gate. A top surface of the silicide contact pad is recessed relative to a top surface of the memory cell gate. Dielectric sidewall spacers extend along sidewalls of the recess from the top surface of the memory cell gate to the top surface of the silicide contact pad.

Other embodiments relate to an integrated circuit (IC) for an embedded flash memory device. The IC is formed on a semiconductor substrate, which includes: a memory array region made up of an array of flash memory cells, and a memory contact pad region distinct from the memory array region. A memory cell gate extends from a flash memory cell of the array to the memory contact pad region. A silicide contact pad is arranged over a top surface of the memory cell gate in the memory contact pad region. A top surface of the silicide contact pad in the memory contact pad region is recessed relative to the top surface of the memory cell gate in the memory array region.

Still other embodiments relate to a method for manufacturing an embedded flash memory device. In this method, a semiconductor substrate is received. The substrate includes a select gate and a memory gate that each extend from a memory array region to a memory contact pad region. Recessed regions are selectively formed in the memory contact pad region for the memory gates and select gates. Dielectric sidewall spacers are formed on the sidewalls of the recessed regions and on gates of logic devices outside of the memory array region. Nickel silicide is formed on upper surfaces of the memory gate and select gate in the memory contact pad region and is concurrently formed for source/drain regions of the logic devices.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit (IC) for an embedded flash memory device, the integrated circuit comprising:
    a flash memory cell having a memory gate with a plurality of memory gate fingers projecting from a sidewall of the memory gate, wherein two or more dummy select gates are interdigitated with the plurality of memory gate fingers, wherein a first of the memory gate fingers separates a second of the memory gate fingers from a third of the memory gate fingers and wherein the first of the memory gate fingers has an upper surface that is recessed relative to both an upper surface of the second of the memory gate fingers and an upper surface of the third of the memory gate fingers;
    a silicide contact pad arranged over the first of the memory gate fingers, wherein a top surface of the silicide contact pad is recessed relative to the upper surface of the second of the memory gate fingers; and
    a dielectric sidewall spacer over the upper surface of the first of the memory gate fingers and extending from an upper surface of the second of the memory gate fingers to the top surface of the silicide contact pad.

2. The IC of claim 1, further comprising a vertical contact coupled to the silicide contact pad.

3. The IC of claim 1, where the silicide contact pad extends continuously on the upper surface of the memory gate between inner sidewalls of the dielectric sidewall spacers.

4. The IC of claim 1, further comprising:
    a charge trapping dielectric structure extending along outermost sidewalls of the memory gate.

5. The IC of claim 1, wherein the dielectric sidewall spacers comprise an oxide or nitride material.

6. The IC of claim 1, wherein a first of the two or more dummy select gates separates the first of the memory gate fingers from the second of the memory gate fingers, and a second of the two or more dummy select gates separates the first of the memory gate fingers from the third of the memory gate fingers, wherein the first of the two or more dummy select gates has a height that differs from that of the second of the two or more dummy select gates.

7. An integrated circuit (IC) for an embedded flash memory device, the integrated circuit comprising:
a semiconductor substrate including: a memory array region made up of an array of flash memory cells, and a memory contact pad region distinct from the memory array region;
a memory gate that extends in a first direction from a flash memory cell of the array to the memory contact pad region;
a select gate that extends from the flash memory cell of the array to the memory contact pad region in parallel with the memory gate;
wherein the memory gate turns to extend in a second direction, which is perpendicular to the first direction, within the memory contact pad region and runs between a first dummy select gate and a second dummy select gate within the memory contact pad region, the first dummy select gate having a first height and the second dummy select gate having a second height different from the first height; and
a silicide contact pad arranged over a top surface of the memory gate in the memory contact pad region, wherein a top surface of the silicide contact pad in the memory contact pad region is recessed relative to the top surface of the memory gate in the memory array region.

8. The IC of claim 7, wherein the silicide contact pad is arranged in a recess within the top surface of the memory gate in the memory contact pad region.

9. The IC of claim 8, wherein a dielectric sidewall spacer extends along sidewalls of the recess from an upper surface of the first dummy select gate to the top surface of the silicide contact pad at a bottom of the recess.

10. The IC of claim 8, further comprising a vertical contact extending through the recess and coupled to the silicide contact pad at a location in the memory contact pad region.

11. The IC of claim 7, further comprising:
a logic region arranged in the semiconductor substrate;
a logic device arranged in the logic region and including a metal gate separated from the semiconductor substrate by a material having a dielectric constant exceeding 3.9; and
wherein the top surface of the memory gate in the memory contact pad region and a top surface of the silicide contact pad are recessed relative to a top surface of the metal gate.

12. The IC of claim 7, further comprising:
a charge trapping dielectric structure extending along outermost sidewalls of the memory gate.

13. The IC of claim 9, wherein the dielectric sidewall spacer comprises an oxide or nitride material.

14. The IC of claim 7, wherein the first dummy select gate has a first dummy select gate upper surface which is co-planar with a top surface of the memory gate in the memory array region, and the second dummy select gate has a second dummy select gate upper surface which is coplanar with the top surface of the memory gate in the memory contact pad region.

15. The IC of claim 7, wherein the first dummy select gate has a first height and the second dummy select gate has a second height, which is different from the first height.

16. The IC of claim 9, wherein outer edges of the recess are defined by innermost sidewalls of the dielectric sidewall spacer, wherein a first of the innermost sidewalls is directly over an edge portion of the memory gate and a second of the innermost sidewalls is directly over an edge portion of the second dummy select gate.

17. An integrated circuit (IC) for an embedded flash memory device disposed on a semiconductor substrate, the IC comprising:
a flash memory cell including: a source region and a drain region which are separated from one another by a channel region within the semiconductor substrate, a select gate arranged over the channel region and separated from the channel region by a dielectric layer, and a memory gate arranged alongside the select gate and over the channel region and separated from the channel region by a charge trapping structure, wherein upper surfaces of the select gate and memory gate are co-planar with one another along a first plane; and
a contact extending downward to make electrical contact with the select gate or the memory gate at a location that is spaced laterally apart from the flash memory cell, wherein the select gate or memory gate has a recessed upper surface at the location such that the recessed upper surface lies below the plane and the contact extends below the plane to make contact with the recessed upper surface;
a dummy gate structure arranged alongside the select gate or the memory gate at the location, the dummy gate structure having an upper surface that is co-planar with the recessed upper surface of the select gate or memory gate; and
sidewall spacers on opposite sides of the contact and nearest the contact, wherein a first of the sidewall spacers extends upwardly from the recessed upper surface of the memory gate or the select gate and has a first upper sidewall spacer surface that terminates on the plane, and wherein a second of the sidewall spacers extends upwardly from the upper surface of the dummy gate structure and has a second upper sidewall spacer surface that terminates on the plane.

18. The IC of claim 17, further comprising:
a silicide region on the recessed upper surface of the memory gate or the select gate, wherein the silicide region is self-aligned to inner sidewalls of the sidewall spacers.

19. The IC of claim 17, further comprising:
a silicide contact pad arranged at the location and providing ohmic contact between the contact and the select gate or memory gate.

20. The IC of claim 17, further comprising:
a charge trapping dielectric structure extending along outermost sidewalls of the select gate or the memory gate.

* * * * *